(12) United States Patent
Oka et al.

(10) Patent No.: US 7,390,198 B2
(45) Date of Patent: Jun. 24, 2008

(54) ELECTRIC JUNCTION BOX

(75) Inventors: Tatsuya Oka, Yokkaichi (JP); Yukinori Kita, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 37 days.

(21) Appl. No.: 11/630,003

(22) PCT Filed: May 24, 2005

(86) PCT No.: PCT/JP2005/009408

§ 371 (c)(1),
(2), (4) Date: Dec. 19, 2006

(87) PCT Pub. No.: WO2006/006305

PCT Pub. Date: Jan. 19, 2006

(65) Prior Publication Data

US 2008/0014767 A1   Jan. 17, 2008

(30) Foreign Application Priority Data

Jul. 13, 2004  (JP)  ............... 2004-206199

(51) Int. Cl.
*H01R 12/00*  (2006.01)
(52) U.S. Cl. .................. 439/76.2; 439/949
(58) Field of Classification Search .......... 439/76.2, 439/76.1, 949
See application file for complete search history.

(56) References Cited

U.S. PATENT DOCUMENTS

| | | | |
|---|---|---|---|
| 5,785,532 A | 7/1998 | Maue et al. | |
| 6,325,642 B2 * | 12/2001 | Asao | 439/76.2 |
| 6,796,808 B2 * | 9/2004 | Hosoe et al. | 439/76.2 |
| 6,905,348 B2 * | 6/2005 | Naitou et al. | 439/76.2 |
| 6,984,133 B2 * | 1/2006 | Naitou et al. | 439/76.2 |
| 7,267,556 B2 * | 9/2007 | Oka et al. | 439/76.2 |
| 2002/0022387 A1 | 2/2002 | Sumida | |
| 2002/0197893 A1 | 12/2002 | Hiroyuki et al. | |
| 2008/0038943 A1 * | 2/2008 | Hayakawa et al. | 439/76.2 |

FOREIGN PATENT DOCUMENTS

| | | |
|---|---|---|
| JP | A 8-340617 | 12/1996 |
| JP | A 9-233650 | 9/1997 |
| JP | A 2001-313132 | 11/2001 |
| JP | A 2001-359223 | 12/2001 |
| JP | A 2002-058134 | 2/2002 |
| JP | A 2002-084623 | 3/2002 |
| JP | A 2003-009347 | 1/2003 |

* cited by examiner

*Primary Examiner*—Truc Nguyen
*Assistant Examiner*—X Chung-Trans
(74) *Attorney, Agent, or Firm*—Oliff & Berridge, PLC

(57) ABSTRACT

In a case, a branch circuit unit, a multifunction relay unit and a relay unit are stored, being subsequently arranged in parallel. The branch circuit unit is composed of a laminated body of a bus bar and an insulating board, and a first printed board provided with a conductor on the both front and rear planes. The multifunction relay unit is provided with a second printed board whereupon an electric component is mounted, and a relay connector which connects the conductors of the first to the third printed boards. An external connecting terminal is protruded from the conductor of the second printed board and is protruded into a connector fitting part provided on the case. The relay unit is mounted with a plurality of relays on the third printed board.

4 Claims, 5 Drawing Sheets

[Prior Art]

ELECTRIC JUNCTION BOX

TECHNICAL FIELD

The present invention relates to an electric junction box and more particularly to an electric junction box which is made compact and lightweight by constructing a branch circuit of an internal circuit of a laminate consisting of bus bars and insulating plates and printed-circuit boards.

BACKGROUND ART

Owing to a rapid increase of electric and electronic parts to be mounted on a car body, there is an increase in the number of electric junction boxes, to be connected with a wire harness for use in the car body, which accommodates a printed-circuit board having electric and electronic parts mounted thereon.

The electric junction box of this kind in which an internal circuit is constructed of a bus bar laminate consisting of bus bars and insulating plates alternately layered thereon and a printed-circuit board having electronic parts mounted thereon is disclosed in Japanese Patent Application Laid-Open No. 9-233650 (patent document 1) and the like.

As shown in FIG. 6, the electric junction box 1 disclosed in the patent document 1 accommodates in the casing thereof the laminate 4 consisting of the bus bars 2 and the insulating plates 3 alternately layered thereon and the circuit substrate (printed-circuit board) 6 having the electronic parts 5 mounted thereon. The supporting bus bar tabs 2a projected from the bus bars 2 support the circuit substrate 6. The connecting bus bar 2b projected from the bus bars 2 is inserted into the connector 6a provided on the circuit substrate 6 to electrically connect the bus bars 2 with the electric conductor of the circuit substrate 6.

As described above, the circuit of the printed-circuit board is connected with the bus bars through the connector and with a connector of a wire harness of an external circuit through the bus bars. Therefore with an increase of relays and the like to be mounted on the printed-circuit board, the number of layers of the bus bars increases. Consequently the electric junction box becomes large and complicated in its construction.

Patent document 1: Japanese Patent Application Laid-Open No. 9-233650

DISCLOSURE OF THE INVENTION

Problems to be Solved by the Invention

The present invention has been made in view of the above-described problems. It is an object of the present invention to decrease the number of layers of bus bars to be accommodated in an electric junction box to a possible highest extent by enhancing the utilization efficiency of a printed-circuit board to thereby prevent the electric junction box from becoming large in size and weight thereof.

MEAN FOR SOLVING THE PROBLEMS

To solve the above-described problems, the present invention provides an electric junction box, a casing of which accommodates a branch circuit unit, a multi-function relay unit, and a relay unit arranged sequentially in parallel, wherein the branch circuit unit includes a laminate consisting of bus bars and insulating plates alternating with the bus bars and a first printed-circuit board which is disposed adjacently and parallel to the laminate and has an electric conductor on each of two sides thereof without having electric parts mounted thereon, wherein relay pins are projected toward the multi-function relay unit;

the multi-function relay unit has a second printed-circuit board having electric parts mounted thereon and a relay connector mounted on the second printed-circuit board by penetrating the relay connector through an open portion formed on the second printed-circuit board, wherein the relay connector has a first relay terminal for connecting relay pins inserted thereinto from both sides thereof with each other and a second relay terminal for connecting a relay pin inserted thereinto from one side thereof with an electric conductor of the second printed-circuit board, wherein an external connection terminal is projected from the electric conductor of the second printed-circuit board into a connector fit-in portion formed in the casing;

the relay unit has a plurality of relays mounted on a third printed-circuit board thereof, wherein a relay pin is connected with an electric conductor of the relay unit connected with the relays and projected toward the multi-function relay unit; and relay pins for connecting the branch circuit unit and the relay unit with each other are connected with the first relay terminal of the multi-function relay unit, wherein one of the relay pins is connected with the second relay terminal and connected with a connector disposed at a wire harness terminal fitted in the connector fit-in portion through the electric conductor of the second printed-circuit board.

As described above, in the present invention, the multi-function relay unit composed of the second printed-circuit board and the relay connector mounted thereon is disposed between the branch circuit unit and the relay unit. Therefore it is possible to connect the circuit of the branch circuit unit and that of the relay unit with the electric conductor of the second printed-circuit board through the relay connector. Further it is possible to directly connect the circuit of the branch circuit unit and that of the relay unit with each other. Furthermore it is possible to connect the circuit of the branch circuit unit and that of the relay unit with the electric conductor of the second printed-circuit board. Further the external connection terminal is projected from the circuit of the second printed-circuit board into the connector fit-in portion and connected with the connector disposed at the wire harness terminal. That is, heretofore the circuit of the printed-circuit board is connected with the connector of the wire harness through the bus bar. But according to the present invention, the circuit of the printed-circuit board is connected with the external circuit not through the bus bar. Thus it is possible to decrease the number of layers of the bus bars.

Further in the branch circuit unit, both the bus bar and the printed-circuit board having the electric conductor provided on its both two sides are used. This construction makes the number of layers smaller than a construction of the branch circuit unit consisting of the bus bar.

Owing to the above-described two points (the direct connection between the circuit of the printed-circuit board and the external circuit and the use of the printed-circuit board for the branch circuit unit), it is possible to minimize the number of layers of the bus bars, prevents the electric junction box from becoming large and heavy, and decrease the cost of a die for forming the bus bar.

In the branch circuit unit constructed of the bus bar and the printed-circuit board, the bus bar formed by punching a conductive metal plate is used to form a high-current circuit, whereas the electric conductor, consisting of a copper foil or the like, which is formed on the printed-circuit board is used to form a low-current circuit. For example, an electric circuit through which electric current of not less than 20 amperes flows is constructed of the bus bar, whereas a load-applied side electric circuit through which electric current of not more than 20 amperes flows is constructed of the electric conductor of the printed-circuit board. Thereby the number of layers of the bus bars is decreased. But the electric circuit through which the electric current of not less than 20 amperes flows does not necessarily have to be constructed of only the bus bars, and the load-applied side electric circuit through which the electric current of not more than 20 amperes flows does not necessarily have to be constructed of only the electric conductor of the printed-circuit board either. In dependence on convenience in the designing of a circuit, a part of the circuit through which the electric current of not more than 20 amperes flows may be constructed of the bus bar. A part of a circuit through which the electric current of not less than 20 amperes flows may be constructed of the electric conductor of the printed-circuit board. The boundary between the value of electric current which flows the circuit constructed of the bus bars and that of the electric current which flows the circuit constructed of the electric conductor of the printed-circuit board is not limited to 20 amperes, but may be set to about 15 amperes.

It is preferable that tabs formed on the bus bars of the branch circuit unit or/and a connection terminal connected with the electric conductor of the first printed-circuit board are connected with terminals of fuses, connectors, and relays mounted on one surface of the casing not through a relay terminal; and the connector fit-in portion into which the external connection terminal is projected from the second printed-circuit board of the multi-function relay unit is formed on other surface of the casing.

That is, the bus bar of the branch circuit unit and the connector of the wire harness disposed at its terminal are connected with each other on one surface of the casing, whereas the electric conductor of the second printed-circuit board of the multi-function relay unit and the connector of the wire harness disposed at its terminal are connected with each other on the other surface of the casing. Therefore the connector fit-in portion can be efficiently disposed on two sides of the casing. Further it is unnecessary to use the relay terminal in the above-described connections between the connector and the bus bar of the branch circuit unit and the electric conductor of the second printed-circuit board of the multi-function relay unit. Therefore it is possible to decrease the number of parts.

EFFECT OF THE INVENTION

As described above, in the present invention, firstly, the multi-function relay unit is disposed between the branch circuit unit and the relay unit. Therefore it is possible to achieve an efficient circuit construction. Further the external connection terminal projected from the second printed-circuit board of the multi-function relay unit is directly connected with the connector of the wire harness terminal disposed at its terminal without the intermediary of the bus bar. Thus it is possible to decrease the number of layers of the bus bars.

Secondly, because the branch circuit unit is constructed of the bus bar and the printed-circuit board having the electric conductor disposed on both sides thereof, it is possible to decrease the number of the layers of the bus bars.

As described above, the electric junction box is not complicated in its circuit construction and can be made compact and lightweight.

EXPLANATIONS OF REFERENCE NUMERALS AND SYMBOLS

Figure 1:
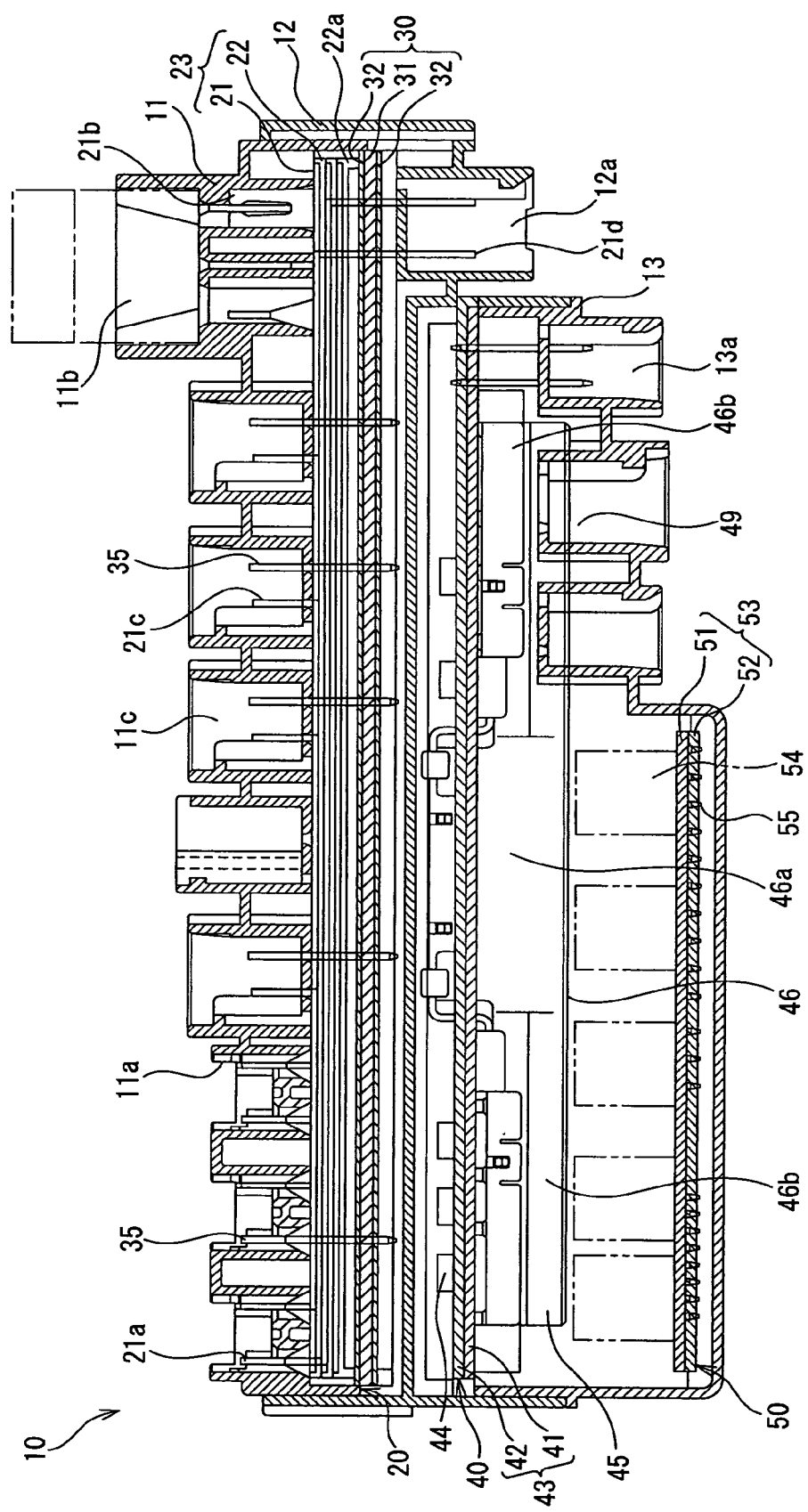
FIG. 1 is a sectional view of an electric junction box of an embodiment of the present invention.
Figure 2:
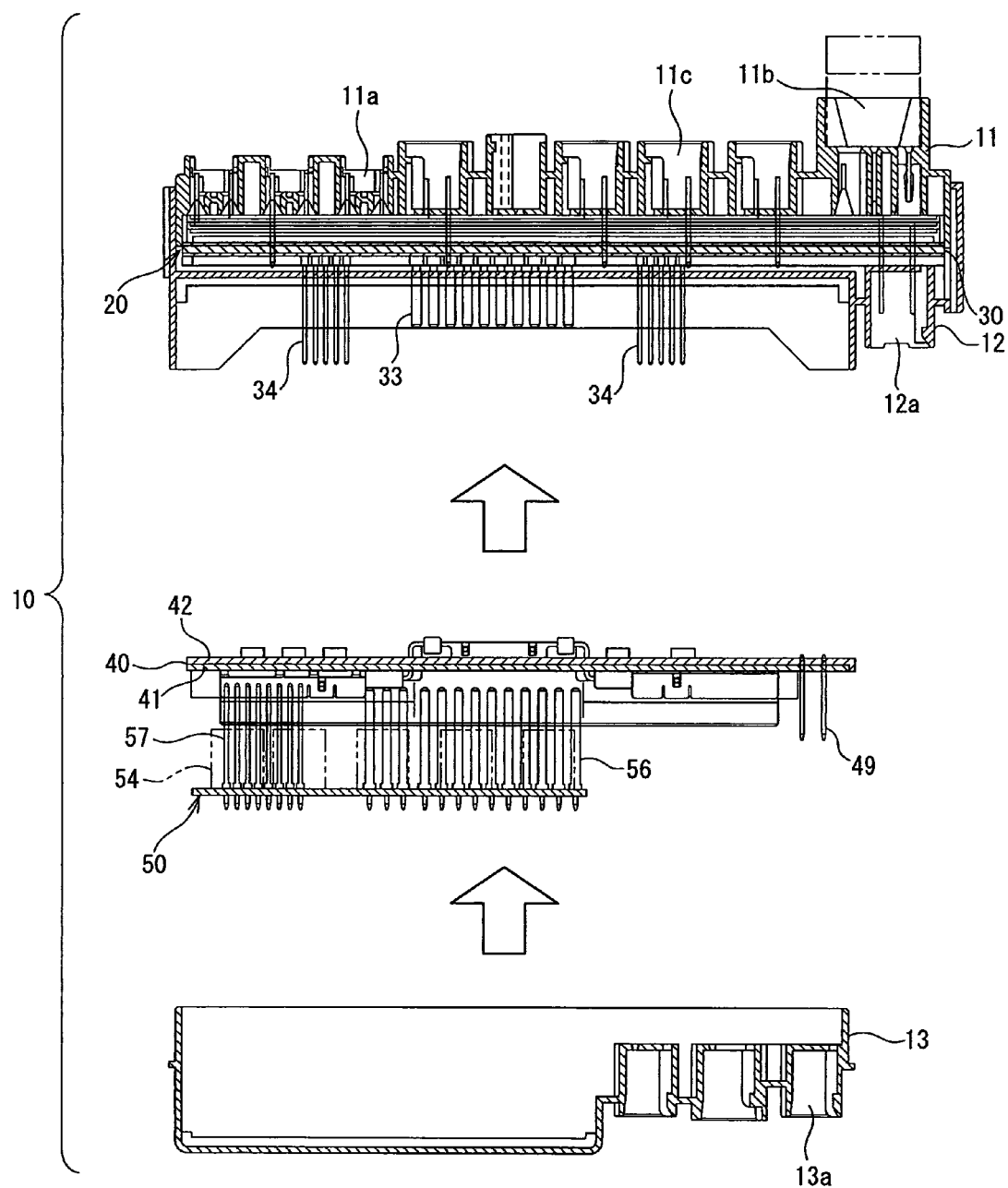
FIG. 2 is an exploded sectional view of the electric junction box.
Figure 3A:
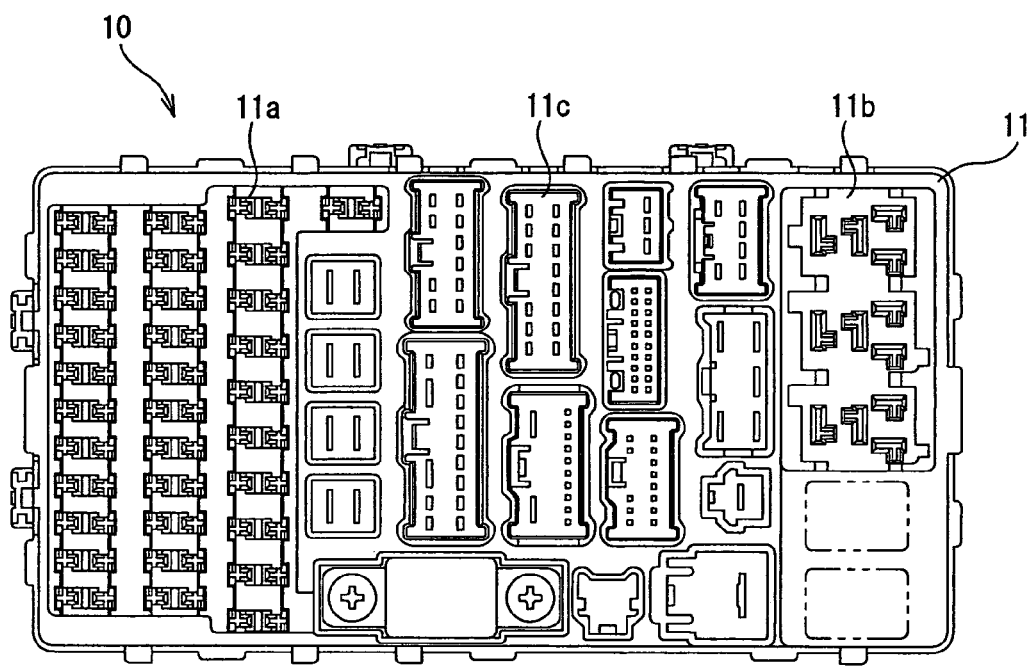
FIG. 3 shows the electric junction box, in which (A) is a plan view, and (B) is a bottom view.
Figure 3B:
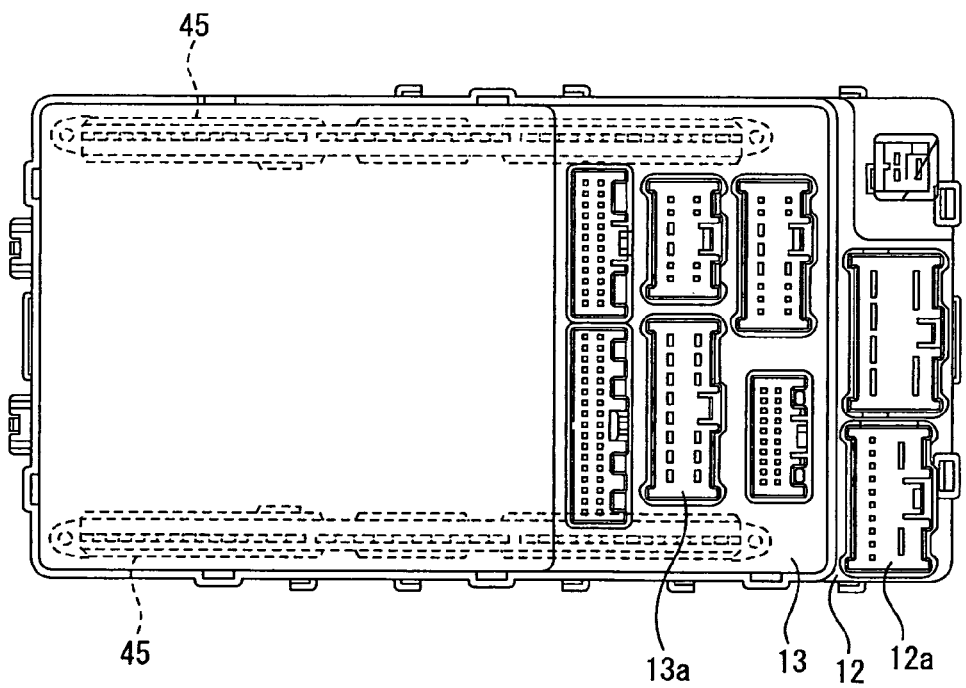

10: electric junction box
20: branch circuit unit
21: bus bar
23: laminate
30: first printed-circuit board
32: electric conductor
33, 34: relay pin
35: connection terminal
40: multi-function relay unit
42: electric conductor
43: second printed-circuit board
45: relay connector
49: external connection terminal
50: relay unit
52: electric conductor
53: third printed-circuit board
54: substrate relay
56, 57: relay pin
60: first relay terminal
61: second relay terminal

BEST MODE FOR CARRYING OUT THE INVENTION

The embodiment of the present invention is described with reference to the drawings.

FIGS. 1 through 5 show an embodiment of the present invention. An electric junction box 10 is formed by combining an upper case 11, an intermediate case 12, and a lower case 13 with one another. A branch circuit unit 20, a multi-function relay unit 40, and a relay unit 50 constructing an internal circuit are fixedly accommodated in parallel inside a casing with the branch circuit unit 20, the multi-function relay unit 40, and the relay unit 50 spaced at certain intervals in a vertical direction.

The branch circuit unit 20 accommodated in a space surrounded with the upper case 11 and the intermediate case 12 includes a laminate 23 consisting of bus bars 21 formed by punching a conductive metal plate into a predetermined configuration and insulating plates 22 layered on the bus bars 21 alternately and a first printed-circuit board 30 formed by printing an electric conductor 32 of a copper foil or the like in a required circuit configuration on two sides of an insulating substrate 31. A peripheral wall portion 22a is projected downward from a lower surface of a periphery of the lowermost insulating plate 22 of the laminate 23. A lower end surface of the peripheral wall portion 22a is in contact with an upper surface of an insulating substrate 31 of the first printed-circuit board 30 disposed below the laminate 23, with the lower end surface of the peripheral wall portion 22a disposed adjacently and parallel to the upper surface of the insulating substrate 31. Thus a space is formed between the lower surface of the laminate 23 and the upper surface of the first printed-circuit board 30. The upper-side electric conductor 32 of the first printed-circuit board 30 is disposed inside the space.

In this embodiment, the three-layer bus bars 21 and the first printed-circuit board 30 form a branch circuit.

The first printed-circuit board 30 is provided to form the branch circuit and does not have electronic parts and the like mounted thereon.

Of the internal circuits, an electric circuit through which electric current of not less than 20 amperes flow is constructed of the bus bars 21, whereas an electric circuit through which electric current of not more than 20 amperes flow is constructed of the electric conductor 32 of the first printed-circuit board 30.

The multi-function relay unit 40 and the relay unit 50 are accommodated in the space surrounded with the intermediate case 12 and the lower case 13, with the multi-function relay unit 40 disposed at an upper part thereof and the relay unit 50 disposed at a lower part thereof spaced from the upper part at a certain interval.

In the multi-function relay unit 40, a large number of electronic parts 44 for multiplex communication is mounted on a second printed-circuit board 43 formed by printing an electric conductor 42 consisting of a copper foil or the like in a required circuit configuration on an upper surface of an insulating substrate 41. Terminals of the electronic parts 44 are connected with the electric conductor 42 by soldering them thereto.

In the relay unit 50, substrate relays 54 are disposed on a third printed-circuit board 53 formed by printing an electric conductor 52 consisting of the copper foil or the like in a required circuit configuration on a lower surface of an insulating substrate 51. Terminals 55 of the substrate relays 54 are penetrated through the insulating substrate 51 and the electric conductor 52 and connected with the electric conductor 52 by soldering the terminals 55 thereto.

The electric conductors 32, 42, and 52 of the first through third printed-circuit boards 30, 43, and 53 are connected with one another through a relay connector 45 mounted on the second printed-circuit board 43 of the multi-function relay unit 40.

Figure 4:
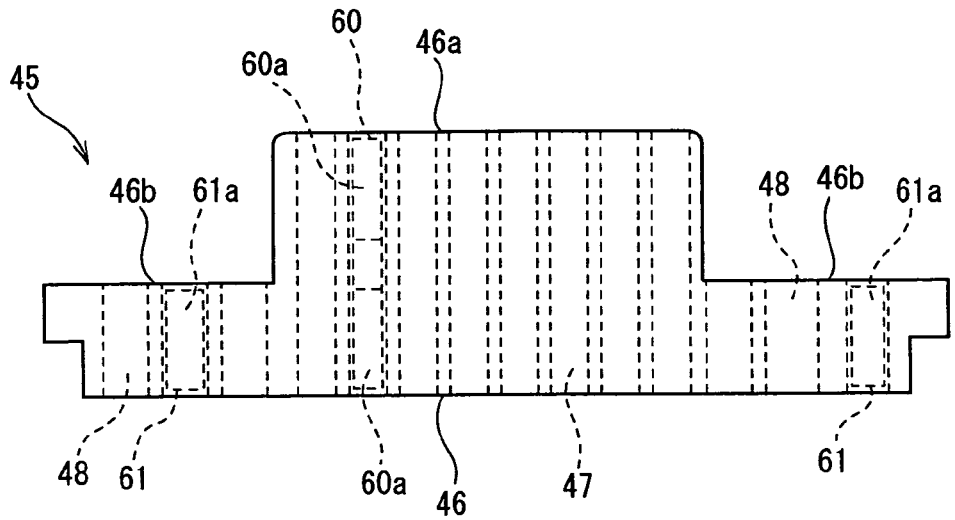
FIG. 4 is a front view of a relay connector.

As shown in FIG. 4, a housing 46 of the relay connector 45 has a longer part 46a vertically long and a shorter part 46b vertically short. First terminal-accommodating portions 47 vertically long are formed in series in the longer part 46a, whereas second terminal-accommodating portions 48 vertically short are formed in series in the shorter part 46b. The longer part 46a stepped from the shorter part 46b is inserted through an opening formed in the insulating substrate 41, and an upper surface of the shorter part 46b and a lower surface of the insulating substrate 41 are fixed to each other with a bolt (not shown) with the upper surface of the shorter part 46b in contact with the lower surface of the insulating substrate 41.

Each of the first terminal-accommodating portions 47 of the relay connector 45 accommodates a long first relay terminal 60 having a female terminal fit-in portion 60a at upper and lower ends thereof. A relay pin 33 connected with the electric conductor 32 of the first printed-circuit board 30 by soldering the relay pin 33 thereto is inserted into the first terminal-accommodating portion 47 from above to connect the relay pin 33 with the upper-side female terminal fit-in portion 60a. At the same time, a relay pin 56 connected with the electric conductor 52 of the third printed-circuit board 53 by soldering the relay pin 33 thereto is inserted into the first terminal-accommodating portion 47 from below to connect the relay pin 56 with the lower-side female terminal fit-in portion 60a. Thereby through the first relay terminal 60, the relay pins 33 and 56 are connected with each other to make the electric conductor 32 of the first printed-circuit board 30 and the electric conductor 52 of the third printed-circuit board 53 conductive with each other.

Figure 5:
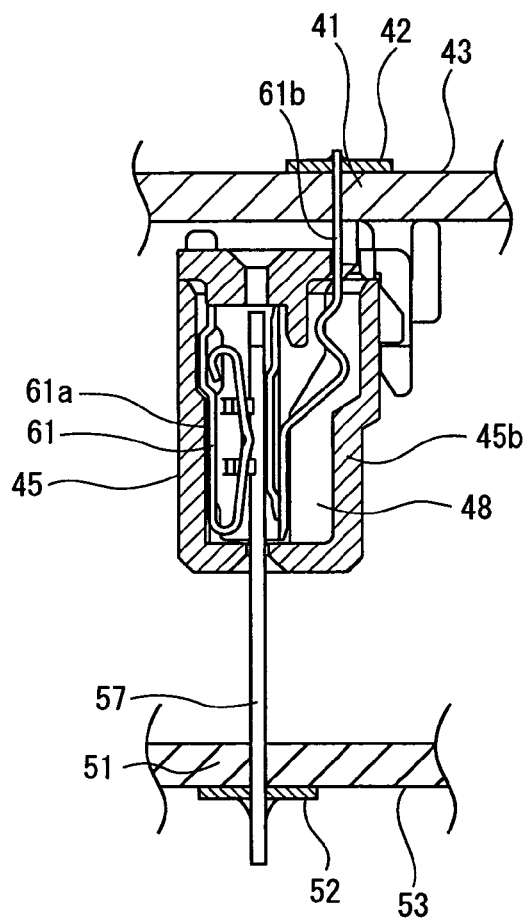
FIG. 5 shows a state in which an electric conductor of a second printed-circuit board and an electric conductor of a third printed-circuit board are connected with each other through the relay connector.
Figure 6:
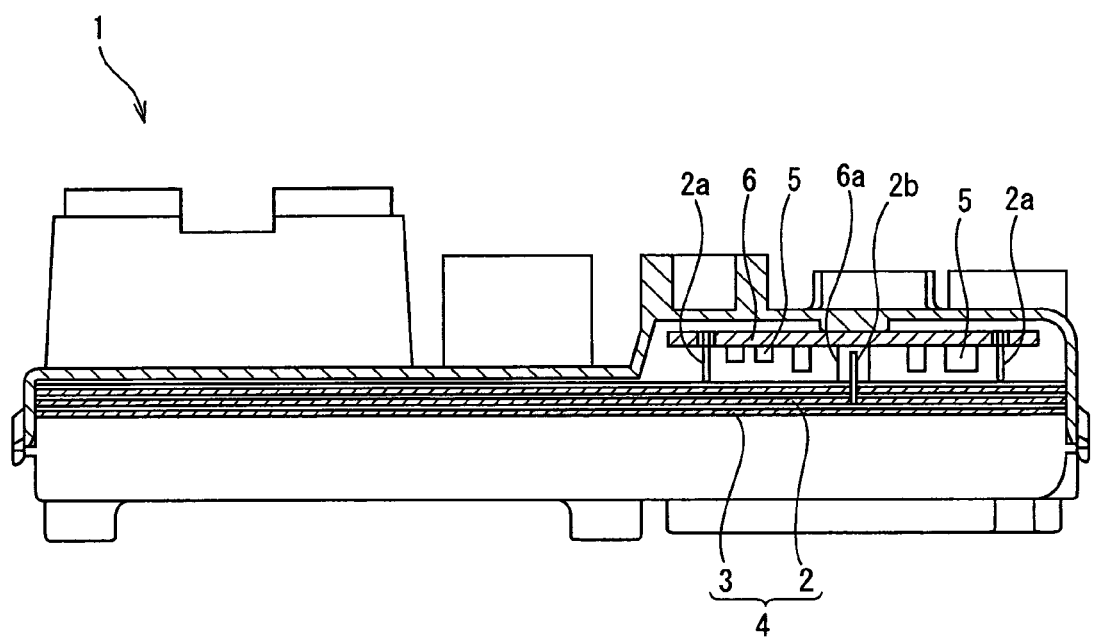
FIG. 6 shows a conventional art.

As shown in FIG. 5, the second terminal-accommodating portion 48 accommodates a second relay terminal 61 having one female terminal fit-in portion 61a and a connection piece 61b directly connected with the electric conductor 42 of the second printed-circuit board 43. A relay pin 34 connected with the electric conductor 32 of the first printed-circuit board 30 by soldering the relay pin 34 thereto is inserted into the second terminal-accommodating portion 48 from above or a relay pin 57 connected with the electric conductor 52 of the third printed-circuit board 53 by soldering the relay pin 57 thereto is inserted into the second terminal-accommodating portion 48 from below to connect the relay pin 57 with the female terminal fit-in portion 61a of the second relay terminal 61. Thereby the relay pin 34 or the relay pin 57 is connected with the electric conductor 42 of the second printed-circuit board 43 through the second relay terminal 61.

The bus bars 21 of the laminate 23 of the branch circuit unit 20 are bent at tips thereof to projectingly form tabs 21a, 21b, 21c, and 21d upward or downward. The tabs 21a, 21b, 21c, and 21d are projected respectively into a fuse-accommodating portion 11a, a relay accommodating portion 11b, and a connector fit-in portion 11c all formed on an upper surface of the upper case 11, and a connector fit-in portion 12a formed on a lower surface of the intermediate case 12 and respectively connected with a terminal of a fuse, a terminal of a relay, and a terminal inside a connector disposed at a wire harness terminal.

Connection terminals 35 soldered to the lower-side electric conductor 32 of the first printed-circuit board 30 of the branch circuit unit 20 are projected upward respectively into the fuse-accommodating portion 11a, the relay accommodating portion 11b, and the connector fit-in portion 11c all formed on the upper surface of the upper case 11 and respectively connected with the terminal of the fuse, the terminal of the relay, and the terminal inside the connector disposed at the wire harness terminal.

External connection terminals 49 are soldered to the electric conductor 42 of the second printed-circuit board 43 of the multi-function relay unit 40 and projected downward therefrom. The external connection terminals 49 are not connected with the electric conductors 32, 52 of the first and second printed-circuit boards 30, 53, but are directly projected into connector fit-in portions 13a formed on a lower surface of the lower case 13 and are connected with the terminals inside the connector (not shown) disposed at the wire harness terminal. That is, the electric conductor 32 of the first printed-circuit board 30 and the electric conductor 52 of the third printed-circuit board 53 connected with the electric conductor 32 through the electric conductor 42 of the second printed-circuit board 43 and the relay connector 45 are connected with the connector disposed at the wire harness terminal through the electric conductor 42 of the second printed-circuit board 43.

The construction of the circuit of the electric junction box 10 is described below.

Initially a power source is supplied to the bus bars 21 of the branch circuit unit 20 from a connector (not shown) fitted in the connector fit-in portion 12a of the intermediate case 12. The supplied power source is distributed to electric and electronic parts as a result of connection between the tab 21c of the bus bar 21 and the connector fitted in the connector fit-in portion 11c of the upper case 11 or is supplied to the first printed-circuit board 30 through a fuse (not shown). The power source supplied to the first printed-circuit board 30 is supplied to the second printed-circuit board 43 and the third printed-circuit board 53 through the relay pin and the relay connector. The power source supplied to the third printed-circuit board 53 passes through the substrate relay 54 and again supplied to the second printed-circuit board 43 through the relay pin 57 and the relay connector 45. The power source supplied to the second printed-circuit board 43 is supplied to the wire harness (not shown) of an external circuit through the external connection terminal 49 connected with the electric conductor 42 of the second printed-circuit board 43 and distributed to each electric and electronic part.

According to the above-described construction, the branch circuit unit 20 constructing branch circuits of the internal circuits of the electric junction box 10 is formed of the laminate 23 consisting of the bus bars 21 and the insulating plates 22 layered on the bus bars 21 alternately and the first printed-circuit board 30 having the electric conductor 32 formed on two sides thereof. Therefore the above-described construction of the branch circuit unit 20 makes the number of the layers of the bus bars 21 smaller than the construction of the branch circuit unit consisting of the laminate 23 of the bus bars 21 and thereby makes the electric junction box 10 compact.

Because the multi-function relay unit 40 having the second printed-circuit board 43 on which the electronic parts 44 is mounted is disposed between the branch circuit unit 20 and the relay unit 50, the electronic parts 44 of the multi-function relay unit 40 can be easily connected with the electric conductor 32 of the first printed-circuit board 30 of the branch circuit unit 20 and the electric conductor 52 of the third printed-circuit board 53 of the relay unit 50 through the relay pin.

As described above, according to the present invention, the multi-function relay unit having the second printed-circuit board on which the electronic parts are mounted is disposed between the branch circuit unit and the relay unit to perform circuit connections. Further unlike the conventional construction, the electric conductor of the second printed-circuit board is directly connected with the connector disposed at the wire harness terminal but not through the bus bar. Therefore the construction of the present invention is capable of decreasing the number of the layers of the bus bars.

What is claimed is:

1. An electric junction box, a casing of which accommodates a branch circuit unit, a multi-function relay unit, and a relay unit arranged sequentially in parallel, wherein said branch circuit unit includes a laminate consisting of bus bars and insulating plates alternating with said bus bars and a first printed-circuit board which is disposed adjacently and parallel to said laminate and has an electric conductor on each of two sides thereof without having electric parts mounted thereon, wherein relay pins are projected toward said multi-function relay unit;

said multi-function relay unit has a second printed-circuit board having electric parts mounted thereon and a relay connector mounted on said second printed-circuit board by penetrating said relay connector through an open portion formed on said second printed-circuit board, wherein said relay connector has a first relay terminal for connecting relay pins inserted thereinto from both sides thereof with each other and a second relay terminal for connecting a relay pin inserted thereinto from one side thereof with an electric conductor of said second printed-circuit board, wherein an external connection terminal is projected from said electric conductor of said second printed-circuit board into a connector fit-in portion formed in said casing;

said relay unit has a plurality of relays mounted on a third printed-circuit board thereof, wherein a relay pin is connected with an electric conductor of said relay unit connected with said relays and projected toward said multi-function relay unit; and relay pins for connecting said branch circuit unit and said relay unit with each other are connected with said first relay terminal of said multi-function relay unit, wherein one of said relay pins is connected with said second relay terminal and connected with a connector disposed at a wire harness terminal fitted in said connector fit-in portion through said electric conductor of said second printed-circuit board.

2. An electric junction box according to claim 1, wherein tabs formed on said bus bars of said branch circuit unit or/and a connection terminal connected with said electric conductor of said first printed-circuit board are connected with terminals of fuses, connectors, and relays mounted on one surface of said casing not through a relay terminal; and said connector fit-in portion into which said external connection terminal is projected from said second printed-circuit board of said multi-function relay unit is formed on other surface of said casing.

3. An electric junction box according to claim 1, wherein said branch circuit unit has more than one layer of said bus bars; and a number of said first printed-circuit boards having said electric conductors formed on said two sides thereof is one.

4. An electric junction box according to claim 2, wherein said branch circuit unit has more than one layer of said bus bars; and a number of said first printed-circuit boards having said electric conductors formed on said two sides thereof is one.

\* \* \* \* \*